United States Patent [19]
Abe

[11] Patent Number: 6,028,366
[45] Date of Patent: Feb. 22, 2000

[54] BALL GRID ARRAY SEMICONDUCTOR DEVICE

[75] Inventor: Masaaki Abe, Kumamoto, Japan

[73] Assignee: NEC Corporation, Tokyo, Japan

[21] Appl. No.: 09/151,770

[22] Filed: Sep. 11, 1998

[30] Foreign Application Priority Data

Sep. 11, 1997 [JP] Japan .................................. 9-247072

[51] Int. Cl.[7] .................................................. H01L 23/48
[52] U.S. Cl. ........................... 257/779; 257/738; 257/780
[58] Field of Search ..................................... 257/667, 738, 257/779, 780

[56] References Cited

U.S. PATENT DOCUMENTS

| | | | |
|---|---|---|---|
| 5,316,788 | 5/1994 | Dibble et al. ............................. | 427/98 |
| 5,480,835 | 1/1996 | Carney et al. ........................... | 437/189 |
| 5,519,580 | 5/1996 | Natarajan et al. ....................... | 361/760 |
| 5,523,920 | 6/1996 | Machuga et al. ........................ | 361/767 |
| 5,889,655 | 3/1999 | Barrow .................................... | 361/760 |

Primary Examiner—Teresa M. Arroyo
Attorney, Agent, or Firm—Young & Thompson

[57] ABSTRACT

The present invention provides a land comprising a recess formed in a packaging portion for receiving a solder ball. The land has a main part having a size which is slightly larger than a size of the solder ball for receiving the solder ball, wherein the land further has at least a flux-escape part extending outwardly from the main part so as to form a sufficient space for allowing any excess amount of a flux to escape into the flux-escape region.

16 Claims, 4 Drawing Sheets

BALL GRID ARRAY SEMICONDUCTOR DEVICE

BACKGROUND OF THE INVENTION

The present invention relates to a semiconductor device, and more particularly to a ball grid array semiconductor device.

In prior art, semiconductor chips are sealed with a resin material or a ceramic material to form a semiconductor package, wherein lead frames are connected to the semiconductor chips and external leads are projected from the semiconductor package, whereby the external leads are solder-bonded to a mounting substrate such as a printed board. This traditional semiconductor device using lead frames requires a large mounting area, making it difficult to scale down the semiconductor device. Recently, a ball grid array semiconductor device has been used which is suitable for reducing mounting area by using grid arrays of solder balls in place of using lead frames. Namely, the ball grid array semiconductor device more suitable for high density packaging than are traditional lead frame semiconductor devices.

FIG. 1A is a plan view illustrative of a conventional land structure for a solder ball in the ball grid array of the ball grid array semiconductor device. FIG. 1B is a cross sectional elevation view illustrative of the conventional land structure for the solder ball in the ball grid array of the ball grid array semiconductor device, taken along an IB-IB, line of FIG. 1A.

A land 2 is formed in a packaging portion 7, wherein the land 2 comprises a circular-shaped recessed portion 8 which has a slightly larger size than a solder ball 1 for receipt of the solder ball 1. Normally, the solder ball 1 is dipped in a flux 3 before placed within the land 2, wherein the flux 3 exists between the solder ball 1 and the land 2. Since, as described above, the land 2 comprises the circular-shaped recessed portion 8 which has the slightly larger size than a solder ball 1, the flux 3 is confined in an extremely narrow space defined between the solder ball 1 and the land 2, whereby the flux 3 floats the solder ball 1 from the land 2, resulting in an electrical disconnection of the solder ball 1 from the land 2.

In Japanese laid-open patent publication No. 64-16637, it is disclosed that, as illustrated in FIG. 2, a solder-flow pattern 5 is formed to permit any excess amount of solder to flow through the solder-flow pattern 5 serving as a flow channel. This conventional technique, however, does solve the problem of the excess flux floating the solder ball off the land.

In the above circumstances, it had been required to develop a novel land structure which makes the ball grid array semiconductor device free from the above problems with the floating of the solder ball from the land by the excess amount of the flux.

SUMMARY OF THE INVENTION

Accordingly, it is an object of the present invention to provide a novel land structure which makes the ball grid array semiconductor device free from the above problems of the floating of the solder ball from the land by the excess amount of the flux, and the resulting electrical disconnection of the solder ball from the land.

An embodiment of the present invention provides a land comprising a recess formed in a packaging portion for receiving a solder ball. The land has a main part having a size which is slightly larger than a size of the solder ball for receiving the solder ball, wherein the land further has at least a flux-escape part extending outwardly from the main part so as to form a sufficient space for allowing any excess amount of a flux to escaped into the flux-escape region.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

It is an object of the present invention to provide a land comprising a recess formed in a packaging portion for receiving a solder ball. The land has a main part having a size which is slightly larger than a size of the solder ball for receiving the solder ball, wherein the land further has at least a flux-escape part extending outwardly outwardly from the main part so as to form a sufficient space for allowing any excess amount of a flux to escape into the flux-escape region.

It is preferable that the main part of the land be circularly-shaped and that the flux-escape part comprises at least one flux-escape channel in the form of a groove on a circumference of the circular-shaped main part of the land.

It is further preferable that the flux-escape part comprises four flux-escape channels in the form of grooves on a circumference of the circular-shaped main part of the land so that a first pair of the four flux-escape channels are positioned on diametrically opposite ends, in a first direction, of the circumference of the circular-shaped main part of the land, whilst a second pair of the four flux-escape channels are positioned on diametrically opposite ends, in a second direction perpendicular to the first direction, of the circumference of the circular-shaped main part of the land.

It is also preferable that the main part of the land be circular-shaped and that the flux-escape part comprises at least a flux-escape tapered expanding portion formed on a circumference of the circular-shaped main part of the land so that the land is cam like shaped having a lobe.

It is also preferable that the main part and the flux-escape part of the land generally form a square having four corner regions serving as the flux-escape parts.

Another objective of the present invention is to provide a ball grid array semiconductor device having a packaging which has a grid array of a plurality of lands for receiving solder balls to form a ball grid array. Each of the lands comprises a recess formed in the packaging portion for receiving the solder ball. Each land has a main part having a size which is slightly larger than a size of the solder ball for receiving the solder ball, wherein each land further has a flux-escape part extending outwardly from the main part so as to form a sufficient space for allowing any excess amount of a flux to escape into the flux-escape region.

Similarly, the main part of each land of the array can be circular, generally square, or cam-like shaped.

DESCRIPTION OF THE PREFERRED EMBODIMENTS

Figure 1A:
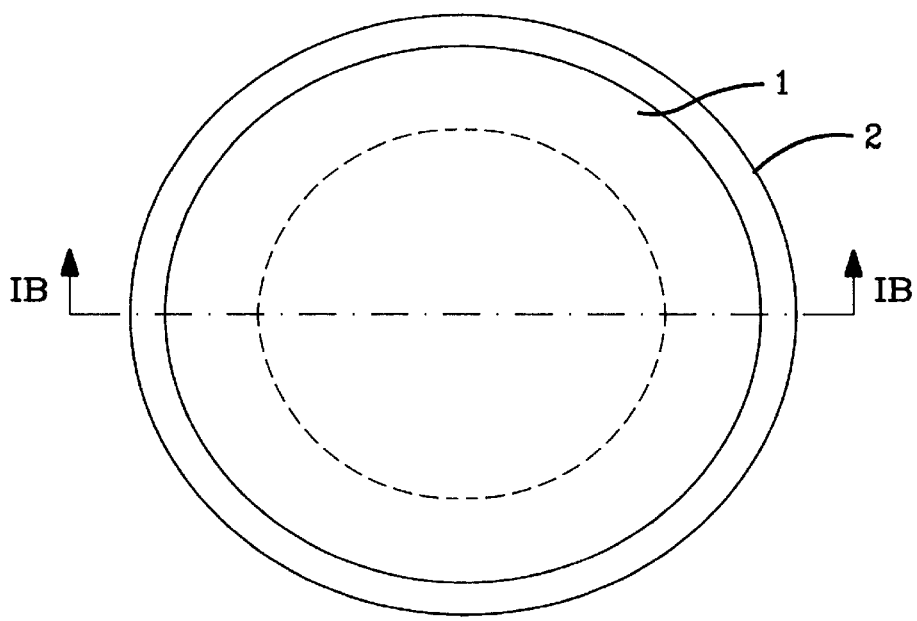
FIG. 1A is a fragmentary plan view illustrative of a first conventional land structure for receiving a solder ball of a ball grid array semiconductor package.
Figure 1B:
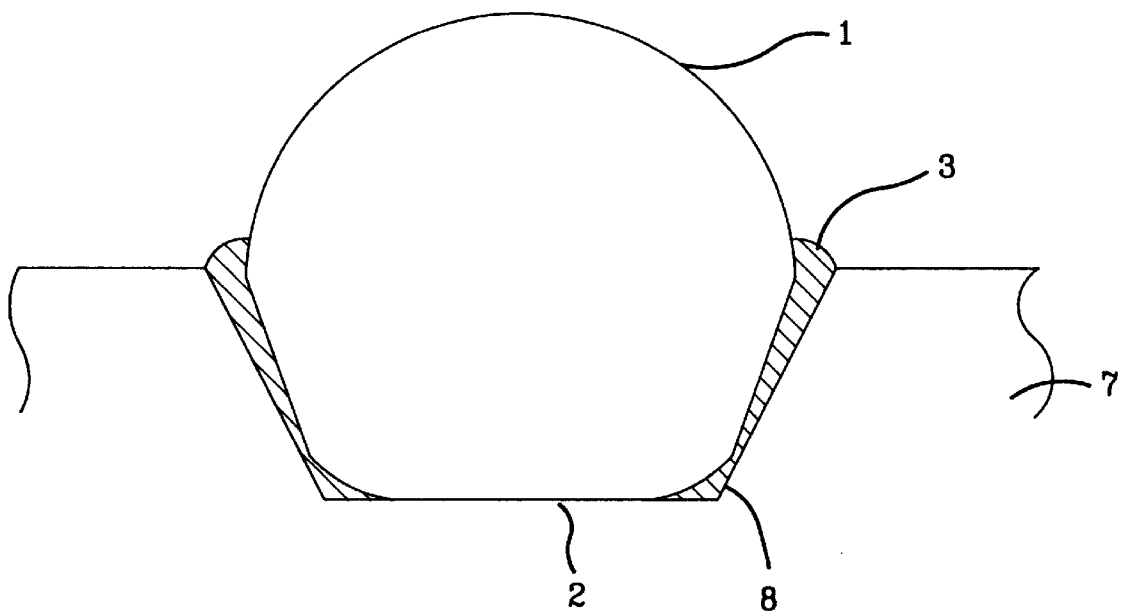
FIG. 1B is a fragmentary cross sectional elevation view illustrative of a first conventional land structure for receiving a solder ball of a ball grid array semiconductor Package, taken along an IB-IB, line of FIG. 1A.
Figure 2:
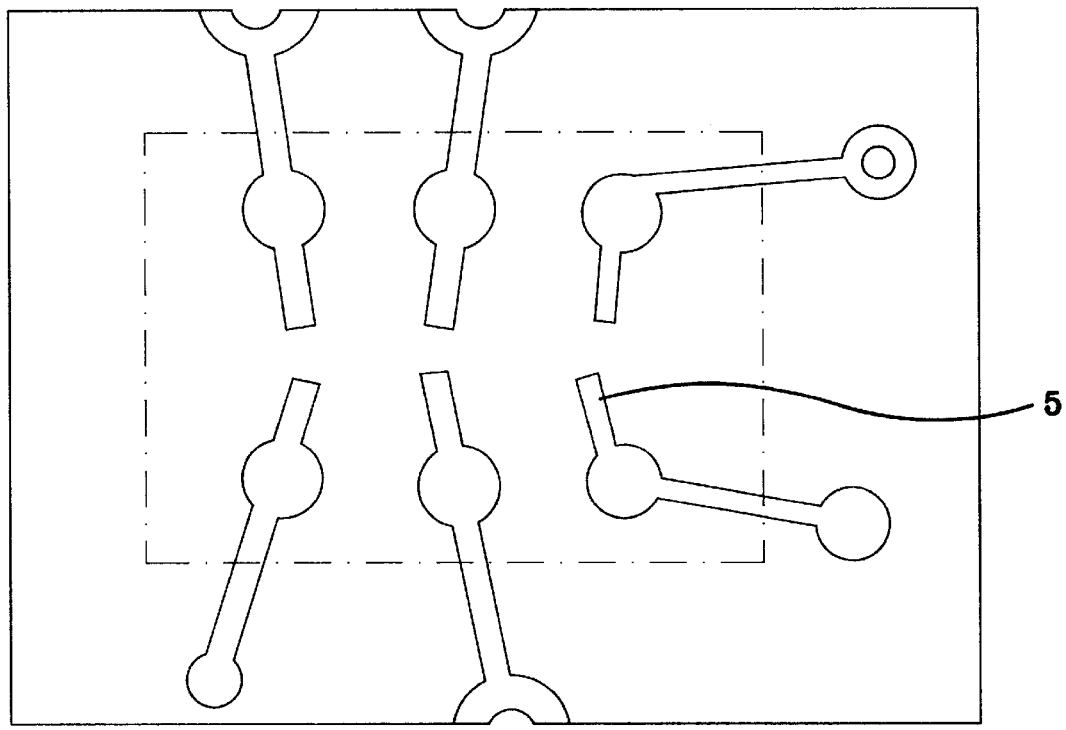
FIG. 2 is a fragmentary plan view illustrative of solder-flow patterns as solder-flow channels over a printed circuit board in the second prior art.
Figure 3A:
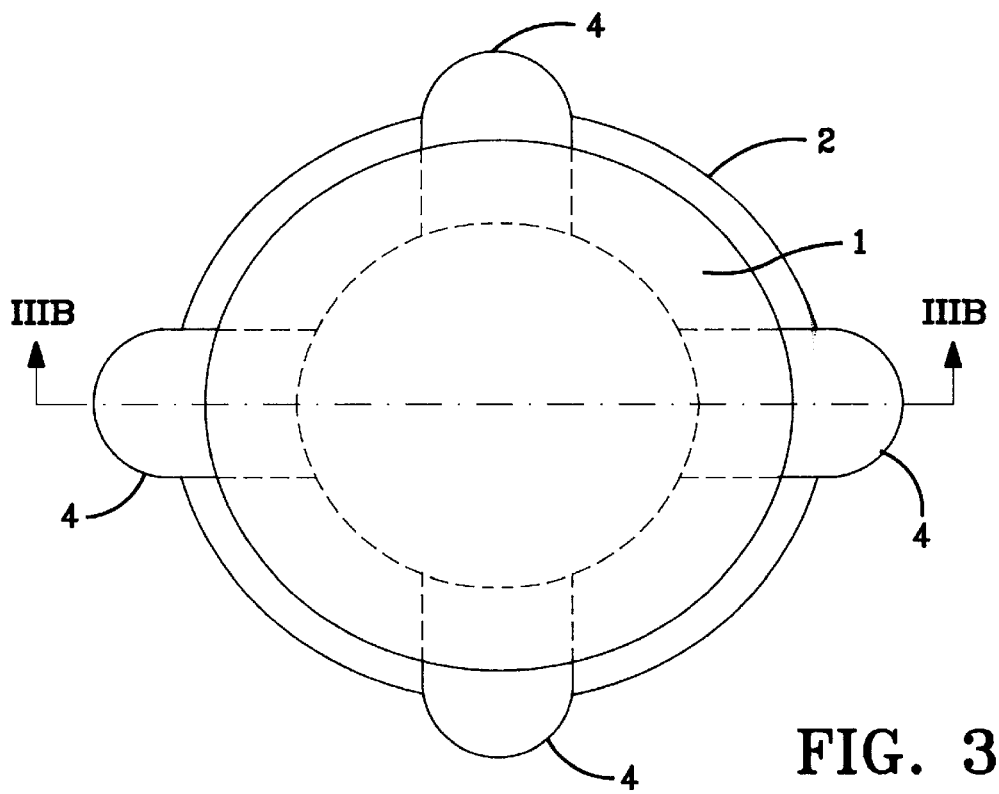
FIG. 3A is a fragmentary plan view illustrative of a novel land structure for receiving a solder ball of a ball grid array semiconductor device in a first embodiment in accordance with the present invention.
Figure 3B:
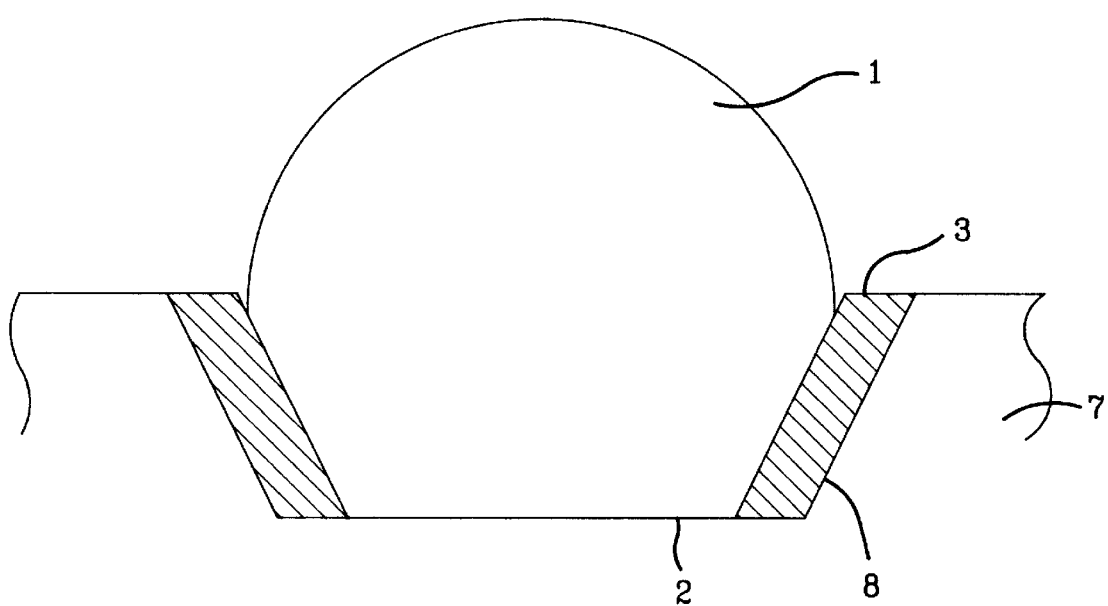
FIG. 3B fragmentary cross sectional elevation, view illustrative of a novel land structure for receiving a solder ball of a ball grid array semiconductor device in a first embodiment in accordance with the present invention, taken along an IIIB-IIIB, line of FIG. 3A.

A first embodiment according to the present invention will be described in detail with reference to FIGS. 3A and 3B.

A land 2 is formed in a package portion 7. The land 2 comprises a circular-shaped recessed portion 8 formed in the package portion 7. The circular-shaped recessed portion 8 has a slightly larger size than a solder ball 1 so that the land 2 receives the solder ball 1. The land 2 has four flux escape channels 4 which are positioned symmetrically with reference to a center of the land 2 and extend radially and outwardly from a circumference of the land 2. Each of the four flux escape channels 4 forms a sufficient space which allows any excess amount of a flux 3 to escape the flux escape channels 4 to avoid floating the solder ball 1 off the land 2 by the excess amount of the flux 3. The first pair of flux escape channels 4 are formed on diametrically opposite ends of the circumference of the land 2 in a first direction. The second pair of escape channels 4 are formed on diametrically opposite ends of the circumference of the land 2 in a second direction perpendicular to the first direction.

The package portion 7 is made of a resin material. The package portion 7, containing the circular-shaped recessed portion 8, the land 2, and the flux escape channels 4, may be formed by use of resin molding die processes at the same time the sealing resin for the semiconductor package is formed. An electrically conductive pattern such as a lead frame is formed on the bottom of the land 2, whereby the solder ball 1 is electrically connected through the flux 3 to the electrically conductive pattern.

The solder ball 1 has a diameter in the range of 0.15–0.75 mm. The sizes of the land 2, such as the depth and diameter, are determined so that the bottom half of the solder ball 1 is received within the land 2 comprising the circular-shaped recessed portion 8. The solder ball 1 is absorbed with an absorbent to be dipped into the flux 3 so that the solder ball 1 is coated with the flux 3, before the flux-coated solder ball 1 is then placed onto the land 2. Subsequently, the package portion 7 is heated to cause the solder ball 1 to be melted, thereby bonding the solder ball to the land 2, whereby the ball grid array semiconductor device is completed.

In accordance with the first embodiment, the four flux escape channels 4 form sufficient spaces to allow any excess amount of flux to escape into the flux escape channels 4 to avoid floating the solder ball 1 from the land 2.

As a modification to the above first embodiment, the number of flux escape channels 4, the positions thereof, and the sizes thereof may be changed to match the various requirements and conditions.

As a further modification to the above first embodiment, the packaging portion may be made of a ceramic in place of the resin material. In this case, laminations of the ceramic layers are used for showing the electrically conductive pattern on the bottom of the land.

Figure 4:
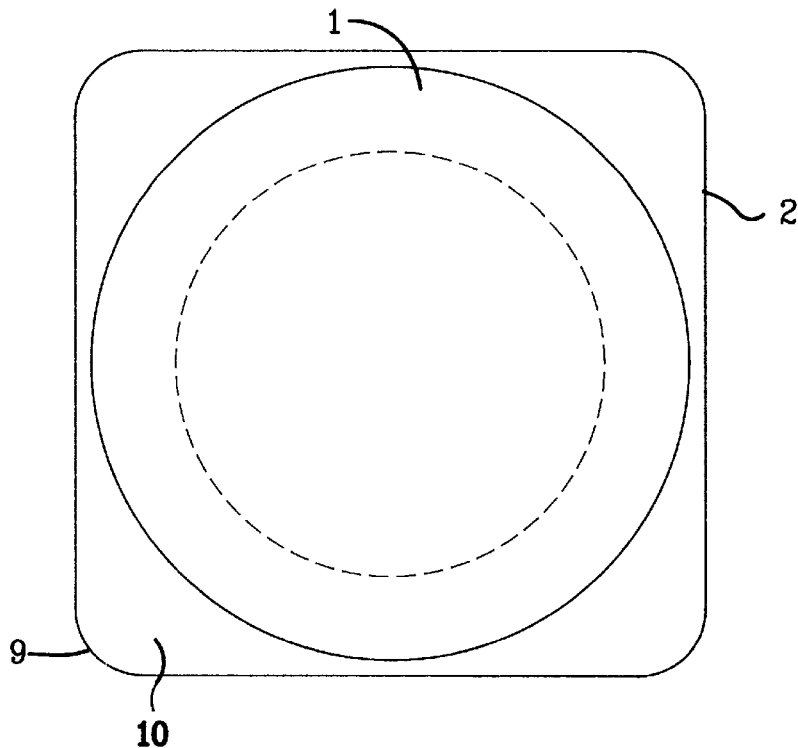
FIG. 4 is a fragmentary plan view illustrative of a novel land structure for receiving a solder ball of a ball grid array semiconductor device in a second embodiment in accordance with the present invention.

A second embodiment according to the present invention will be described in detail with reference to FIG. 4.

In this embodiment, the land 2 for receiving the solder ball 1 has a generally square-shape so that four corner regions of the land 2 form flux-escape regions 10 which provide sufficient spaces for allowing any excess amount of a flux 3 escape into the flux-escape regions 10 so as to avoid floating the solder ball from the land 2. The four corners of the square-shaped land 2 may be rounded to form rounds 9 having a predetermined curvature.

Figure 5:
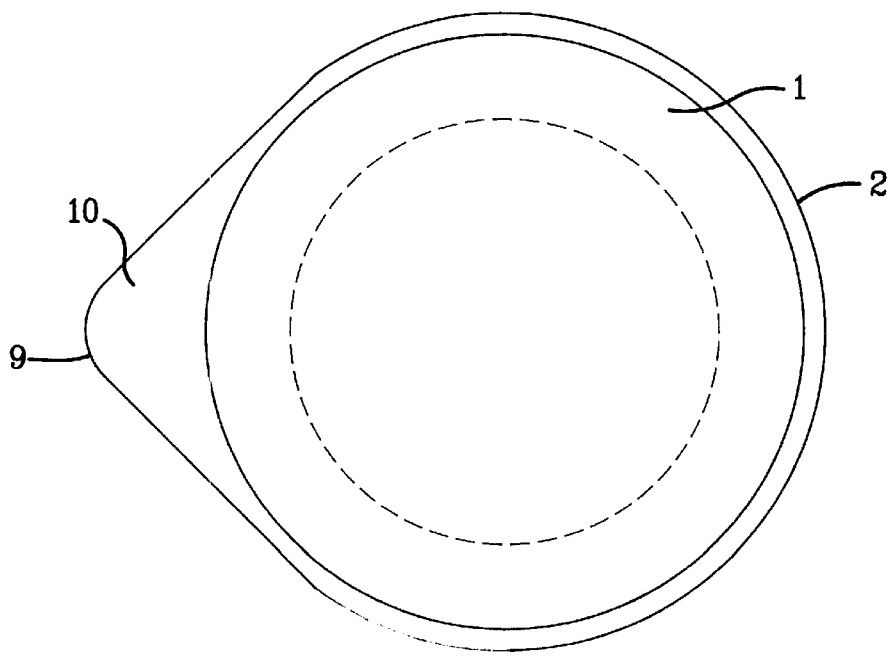
FIG. 5 is a fragmentary plan view illustrative of a novel land structure for receiving a solder ball of a ball grid array semiconductor device in a third embodiment in accordance with the present invention.

A third embodiment according to the present invention will be described in detail with reference to FIG. 5.

In this embodiment, the land 2 for receiving the solder ball 1 has a modified circular-shape, wherein the circular shaped body of the land 2 has a single expanding portion which forms a flux-escape portion 10 providing a sufficient space for allowing and excess amount of a flux 3 to escape into the flux-escape region 10 floating the solder ball from the land 2. The single expanding portion serving as the flux-escape portion is in the form of a loosely tapered expanding portion so that the land 2 has a cam-like shape. The end of the loosely tapered expanding portion has a round 9 having a predetermined curvature.

Whereas modifications of the present invention will be apparent to a person having ordinary skill in the art to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A land structure comprising a vertical recess formed in a packaging portion for receiving a solder ball, and a land at a bottom of said vertical recess, wherein said land structure further comprises at least one flux-escape region extending outwardly from said land and vertically upward from said land and through said packaging portion to form a space to allow a flux to escape into said at least one flux-escape region.

2. The land structure as claimed in claim 1, wherein said land is circular and said at least one flux-escape region comprises a semi-cylindrical groove extending radially outward from a circumference of said land.

3. The land structure as claimed in claim 2, comprising four of said grooves that are arranged symmetrically around the circumference of said land.

4. The land structure as claimed in claim 1, wherein said land is circular and said at least one flux-escape region comprises a generally triangular portion formed on a circumference of said land so that said vertical recess is cam-shaped.

5. The land structure as claimed in claim 1, comprising four of said flux-escape regions that are arranged so that said vertical recess is generally square with rounded corners.

6. A ball grid array semiconductor device comprising a packaging portion, and a plurality of lands for receiving solder balls to form a ball grid array, each of said lands being recessed in said packaging portion for receiving one of said solder balls, each of said lands having a diameter which is larger than a diameter of said solder balls, wherein each of said lands further has at least one flux-escape region extending outwardly therefrom and vertically upward through said packaging portion so as to form a space to allow flux to escape into said at least one flux-escape region.

7. The ball grid array semiconductor device as claimed in claim 6, wherein said lands are circular and said at least one flux-escape region comprises a semi-circular groove formed on, and extending outwardly from a circumference of each respective one of said lands.

8. The ball grid array semiconductor device as claimed in claim 7, comprising four of said grooves that are arranged symmetrically around the circumference of each respective one of said lands.

9. The ball grid array semiconductor device as claimed in claim 6, wherein each of said lands is circular and said at least one flux-escape region comprises a generally triangular portion formed on a circumference of said land so that each of said vertical recesses is cam-shaped.

10. The ball grid array semiconductor device as claimed in claim 6, comprising four of said flux-escape regions that are arranged so that said vertical recess is generally square with rounded corners.

11. A ball grid array semiconductor device comprising:

a packaging portion;

a plurality of solder balls;

a plurality of recessed lands in said packaging portion, each of said recessed lands having thereon a respective one of said solder balls;

a flux-escape means extending into said packaging portion from each said recessed lands for allowing solder flux to escape from between said solder balls and respective ones of said recessed lands so that an electrical connection is established between said respective solder balls and said recessed lands.

12. The ball grid array semiconductor device of claim 11, wherein each of said recessed lands is circular, and said flux-escape means comprises four flux-escape channels that extend symmetrically and radially outwardly from a circumference of each of said lands and vertically upward into said packaging portion.

13. The ball grid array semiconductor device of claim 11, wherein said flux-escape means comprises a generally triangular projection into said packaging portion.

14. A package for a semiconductor device comprising a cover portion with a surface and plural solder ball lands recessed into said cover portion below said surface, each of said recessed plural solder ball lands comprising a recessed center and a peripheral wall ascending from said recessed center to said surface, said peripheral wall having at least one radially outward, semi-cylindrical, groove therein that ascends from said recessed center to said surface.

15. The package for a semiconductor device of claim 14, wherein said recessed center is planar and comprises a peripheral projection from which said groove ascends.

16. The package for a semiconductor device of claim 14, wherein said peripheral wall comprises a plurality of said at least one groove, said plurality of grooves being symmetrically disposed about said recessed center.

\* \* \* \* \*